(12) United States Patent
Nehring et al.

(10) Patent No.: US 10,842,028 B2
(45) Date of Patent: Nov. 17, 2020

(54) METHOD FOR MOUNTING A POWER AMPLIFIER (AP) ASSEMBLY

(71) Applicant: Telefonaktiebolaget LM Ericsson (publ), Stockholm (SE)

(72) Inventors: Ronald Nehring, Stittsville (CA); Mokhtar Rouabhi, Ottawa (CA); Reginald Simpson, Ottawa (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 285 days.

(21) Appl. No.: 15/738,074

(22) PCT Filed: Jun. 16, 2016

(86) PCT No.: PCT/IB2016/053591
§ 371 (c)(1),
(2) Date: Dec. 19, 2017

(87) PCT Pub. No.: WO2016/207765
PCT Pub. Date: Dec. 29, 2016

(65) Prior Publication Data
US 2018/0310416 A1  Oct. 25, 2018

Related U.S. Application Data

(60) Provisional application No. 62/182,987, filed on Jun. 22, 2015.

(51) Int. Cl.
*H05K 3/36* (2006.01)
*H05K 3/34* (2006.01)
(Continued)

(52) U.S. Cl.
CPC ......... *H05K 3/3405* (2013.01); *H05K 1/0243* (2013.01); *H05K 3/3421* (2013.01);
(Continued)

(58) Field of Classification Search
CPC .... H05K 1/0243; H05K 3/325; H05K 3/3421; H05K 3/3405; H05K 2201/10166;
(Continued)

(56) References Cited

U.S. PATENT DOCUMENTS 3,303,265 A   2/1967  Noren et al.
3,609,480 A   9/1971  Gerstner
(Continued)

FOREIGN PATENT DOCUMENTS

CN   103887339 A   6/2014
EP     2518766 A1   3/2012

OTHER PUBLICATIONS

Zimmer, Rene, PCT International Search Report, PCT/IB2016/053591, EPO, Rijswijk, The Netherlands, Sep. 14, 2016.
(Continued)

*Primary Examiner* — Paul D Kim
(74) *Attorney, Agent, or Firm* — Withrow & Terranova, PLLC

(57) ABSTRACT

Methods for mounting a power amplifier (PA) assembly having an extended heat slug (11) are disclosed. According to one aspect, a method includes manufacturing a left side PCB (22a) and a right side PCB (22b). The method further includes sliding the left side PCB and the right side PCB inward (30) to encompass the PA assembly so that one of the left and right side PCB is in a position to contact a drain of the PA (13) and so that the other of the left and right side PCB is in a position to contact a gate of the PA (14).

5 Claims, 7 Drawing Sheets

(51) Int. Cl.
*H05K 1/02* (2006.01)
*H05K 3/32* (2006.01)

(52) U.S. Cl.
CPC ... *H05K 3/325* (2013.01); *H05K 2201/10166* (2013.01); *H05K 2201/10386* (2013.01); *H05K 2201/10446* (2013.01); *H05K 2201/10628* (2013.01); *H05K 2201/10818* (2013.01); *H05K 2201/10969* (2013.01)

(58) Field of Classification Search
CPC .......... H05K 2201/10386; H05K 2201/10446; H05K 2201/10628; H05K 2201/10818; H05K 2201/10969
See application file for complete search history.

(56) References Cited

U.S. PATENT DOCUMENTS

| | | | |
|---|---|---|---|
| 3,864,727 | A | 2/1975 | Schoberl |
| 5,877,555 | A | 3/1999 | Leighton et al. |
| 5,933,327 | A | 8/1999 | Leighton et al. |
| 7,446,411 | B2 | 11/2008 | Condie et al. |
| 7,458,826 | B1 | 12/2008 | Maatta |
| 2003/0207600 | A1* | 11/2003 | Ho .................. H01R 12/725 439/79 |
| 2005/0067716 | A1 | 3/2005 | Mishra et al. |
| 2006/0234530 | A1* | 10/2006 | Chung ................ H05K 3/341 439/79 |
| 2007/0051877 | A1 | 3/2007 | Sakai et al. |
| 2008/0019108 | A1 | 1/2008 | Hoyer et al. |
| 2013/0067736 | A1 | 3/2013 | Peng et al. |
| 2013/0075893 | A1 | 3/2013 | Herbsommer et al. |
| 2014/0070365 | A1 | 3/2014 | Viswanathan et al. |
| 2015/0002226 | A1 | 1/2015 | Meen Kuo et al. |
| 2015/0348867 | A1* | 12/2015 | Wang .................. H01L 23/38 |
| 2017/0230011 | A1* | 8/2017 | Patel .................. H01L 23/66 |
| 2017/0374731 | A1* | 12/2017 | Simpson ............ H01L 23/66 |

OTHER PUBLICATIONS

Restriction Requirement for U.S. Appl. No. 15/526,861, dated Jan. 9, 2018, 8 pages.
Non-Final Office Action for U.S. Appl. No. 15/526,861, dated Mar. 12, 2018, 26 pages.
Final Office Action for U.S. Appl. No. 15/526,861, dated Jul. 31, 2018, 19 pages.
Advisory Action for U.S. Appl. No. 15/526,861, dated Nov. 13, 2018, 4 pages.
Non-Final Office Action for U.S. Appl. No. 15/526,861, dated Mar. 13, 2019, 20 pages.
Final Office Action for U.S. Appl. No. 15/526,861, dated Aug. 14, 2019, 20 pages.
Examination Report for European Patent Application No. 16732762.6, dated Apr. 18, 2018, 8 pages.
International Search Report and Written Opinion for International Patent Application No. PCT/IB2016/053590, dated Sep. 13, 2016, 10 pages.
Search Report for Chinese Patent Application No. 201680037000.6, dated Nov. 4, 2019, 2 pages.
First Office Action for Chinese Patent Application No. 201680037000.6, dated Dec. 8, 2019, 6 pages.
Written Opinion for International Patent Application No. PCT/IB2016/053591, dated Sep. 14, 2016, 7 pages.
Non-Final Office Action for U.S. Appl. No. 15/526,861, dated Jul. 27, 2020, 18 pages.
Intention to Grant for European Patent Application No. 16732762.6, dated Sep. 18, 2020, 9 pages.
Summary of Second Office Action for Chinese Patent Application No. 201680037000.6, dated Jul. 2, 2020, 8 pages.

* cited by examiner

METHOD FOR MOUNTING A POWER AMPLIFIER (AP) ASSEMBLY

TECHNICAL FIELD

This disclosure relates to power amplifiers and, in particular, to methods and arrangements for mounting power amplifiers.

BACKGROUND

Existing power amplifiers (PA) components are mounted using pseudo-surface mount technology (SMT) manufacturing. For PAs, special care and additional manufacturing controls are needed above standard SMT manufacturing to meet PA performance requirements. Standard surface mount technology (SMT) manufacturing place components on one side of a printed circuit board (PCB) and connectivity is completed within the surface plane through solder connections. This is a common overlap joint. Existing PA solutions utilize a custom built printed circuit board (PCB). Metal coins, such as coins made of copper are machined and embedded or attached into the PCB. On the bottom side of the PA is a heat slug that is physically attached to the coin in the PCB. The complex and costly custom built PCB with metal coins provides a surface plane that enables pseudo-SMT manufacturing for existing PA components.

FIGS. 1 and 2 show a perspective view and a top view, respectively, of a known power amplifier module 4. A typical PA module has a drain 1, a gate 2 and a source connection 3. The source 3 has an electrical connection between the base of the PA module 4 and heat slug 5 and has a thermal path through the bottom side of heat slug 5. The heat slug 5 is a clad or composite metal material to match thermal expansion and to improve thermal/electrical conductivity to the PA semiconductor die.

Current PA solutions are inadequate because of cost, yield and reliability issues. Coins complicate PCB manufacturing with added or repeated process steps necessary for coin fabrication and for creating the cavity plating for RF connection to the PCB ground planes. Added or repeated process steps increase PCB manufacturing cost, lengthen the PCB manufacturing cycle time and impact new product time to market (TTM) for frequency band variants. Furthermore, the quality of electrical connections is non-ideal and distant from the PA transistor source. Manufacturing variation in PA placement and the quality of PA attachment to the coin alters PA performance, thereby negatively impacting manufacturing yields. Current PA solutions suffer from a technical contradiction; if PCB coins are used then adequate PA performance is achieved. However, this is accomplished at the expense of making PCB manufacturing difficult, lengthy and costly. If PCB coins are not used, then PCB manufacturing is standard, quick and cost effective, but PA performance is inadequate.

SUMMARY

Some embodiments provide methods for mounting a power amplifier (PA) assembly having an extended heat slug. According to one aspect, a method includes sliding a first PCB inward toward the PA assembly from a first direction to contact a gate of the PA; and sliding a second PCB inward toward the PA assembly from a second direction opposite the first direction to contact a drain of the PA.

According to this aspect, in some embodiments, the first and second PCBs have a source contact area that mates with the extended heat slug of the PA assembly when the first and second PCBs are slid inward to encompass the PA assembly, the extended heat slug being in contact with a source of the PA. According to this aspect, in other embodiments, the first PCB includes a drain contact area on a side of the first PCB opposite a side of the first PCB having the source contact area, the second PCB includes a gate contact area on a side of the second PCB opposite a side of the second PCB having the source contact area, the gate of the PA contacts the gate contact area after the sliding and the drain of the PA contacts the drain contact area after the sliding.

In some embodiments, the method further includes mounting the PA onto the extended heat slug of the PA assembly before sliding the first and second PCBs inward to encompass the PA assembly. In some embodiments, the method further includes pre-depositing solder on the first and second PCBs before sliding the first and second PCBs inward to encompass the PA assembly. In some embodiments, the pre-depositing of solder includes electro-depositing the solder during a PCB manufacturing process prior to sliding the first and second PCBs inward to encompass the PA assembly.

According to another aspect, a method includes mounting a power amplifier (PA) assembly having an extended heat slug. The method includes affixing the PA to the extended heat slug to form the PA assembly; and sliding the PA assembly inward toward a PCB having a cavity to accept the PA assembly.

According to this aspect, in some embodiments, the PCB has a source contact area that mates with the extended heat slug of the PA assembly when the PA assembly is slid inward toward the PCB cavity. In some embodiments, the method further includes pre-depositing solder on contact areas of the PCB before sliding the PA assembly inward toward the PCB cavity. In some embodiments, sliding the PA assembly inward toward the PCB cavity causes contacts of the PCB to contact a drain, gate and source of the PA.

According to yet another aspect, a method is provided for mounting a PA assembly having a PA and an extended heat slug on a first PCB and a second PCB. The method includes sliding the first PCB to contact one of a drain and a gate of the PA; and sliding the second PCB to contact the other of the drain and the gate of the PA. According to this aspect, in some embodiments, the first PCB and the second PCB each have a cavity, and wherein the cavities of the first PCB and the second PCB receive a portion of the PA when the first PCB contacts the one of a drain and a gate of the PA and the second PC contacts the other of the drain and the gate of the PA.

According to yet another aspect, a method is provided for mounting a PA assembly having a PA and an extended heat slug to a printed circuit board, the PCB having a cavity configured to accept the PA assembly. The method includes affixing the PA to the extended heat slug to form the PA assembly and moving the PA assembly into the PCB.

According to this aspect, in another embodiment, the cavity is open at one end and the PA assembly is moved into the PCB by sliding the PA assembly inwardly of the open cavity toward the PCB. In another embodiment, the cavity is enclosed and the PA assembly is moved into the PCB by inserting the PA assembly upwardly of the enclosed cavity into the PCB and the PA assembly is rotated to line up contact areas between the PA and the PCB.

BRIEF DESCRIPTION OF THE DRAWINGS

The embodiments described herein, and the attendant advantages and features thereof, will be more readily understood by reference to the following detailed description when considered in conjunction with the accompanying drawings wherein.

DETAILED DESCRIPTION

Figure 1:
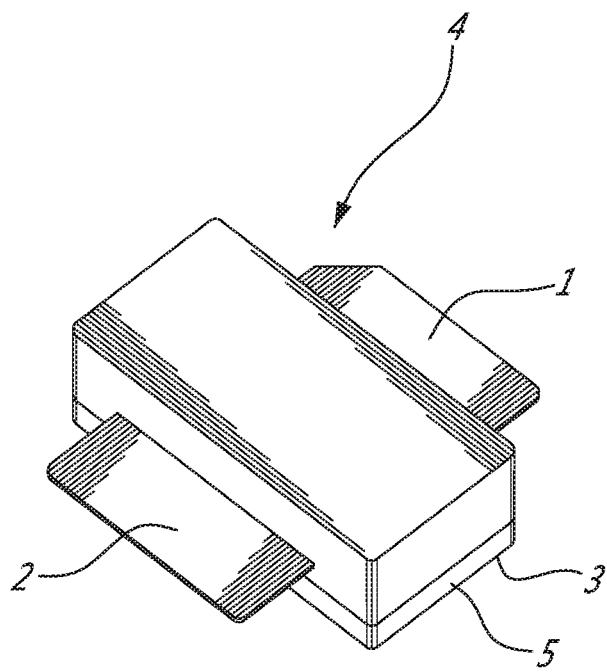
FIG. 1 is a perspective view of a known power amplifier (PA)
Figure 2:
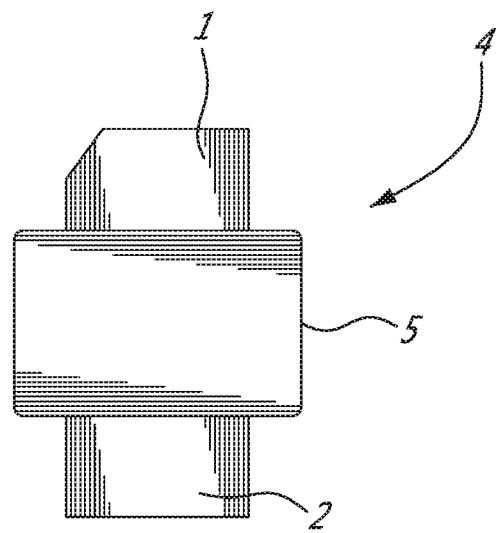
FIG. 2 is a top view of the known PA.

Before describing in detail example embodiments that are in accordance with the present disclosure, it is noted that the embodiments reside primarily in combinations of apparatus components and processing steps related to mounting an RF power amplifier assembly to a Printed Circuit Board. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. In particular, although reference is made to left and right PCBs, these elements may equally be referred to as first and second PCBs in either order, and embodiments are not limited to only left and right PCBs, but may include, for example, top and bottom PCBs when the PA assembly is vertically oriented.

An example of a coinless RF power amplifier assembly is described in U.S. Patent Application Publication No. 2017/0374731 A1, published Dec. 28, 2017.

Figure 3:
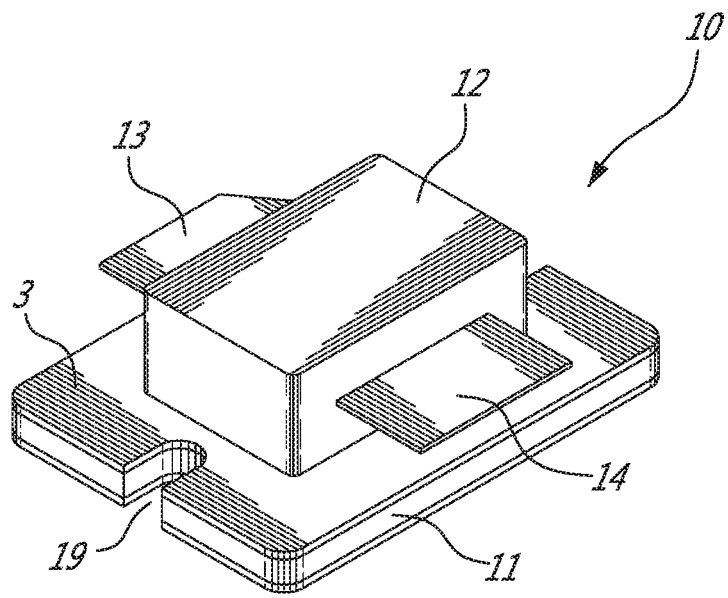
FIG. 3 is a perspective view of power amplifier assembly of a coinless PA with an extended heat slug.

FIG. 3 is a perspective view of a coinless RF power amplifier assembly 10 with an extended heat slug 11 having U-shaped slots 19. The PA 10 can be installed according to methods described herein. In this embodiment, the PA assembly 10 has a housing 12, a drain lead 13 at one end, a gate lead 14 at another end opposite the drain lead 13. The heat slug 11 extends beyond the area defined by the PA housing 12 to facilitate conduction of heat away from the PA housing 12 without a coin and improve electrical connection to the PA source located between the housing and heat slug (not shown). The heat slug 11 may comprise a clad or composite metal having layers, such as a layer of Cu and a layer of CuMo followed by another layer of Cu, i.e., CoMo sandwiched between layers of Cu. The U-shaped slot 19 at each of two ends of the heat slug 11 may facilitate securing the power amplifier assembly 10 to a transmitter (not shown) containing the power amplifier assembly 10.

Figure 4:
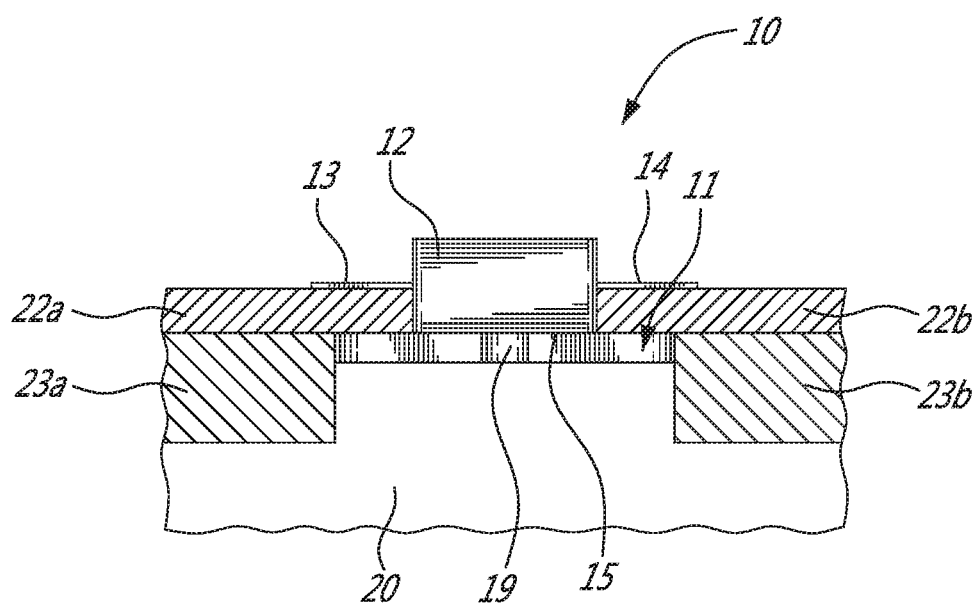
FIG. 4 is a cross sectional view of the power amplifier assembly encompassed by PCBs.

FIG. 4 is cross section of the PA assembly 10 mounted to a casting 20. The PA may include a ceramic ring (not shown) to help control the vertical spacing between the drain lead 13, gate lead 14 and the extended heat slug and source 15. The ceramic ring thickness is closely matched to the thickness of RF PCB 22a, 22b. Although not shown in FIG. 4, the left and right RF PCB 22a, 22b, and PCB 23a, 23b can be a single PCB or multiple PCBs fabricated from different materials. The PA assembly 10 is mounted in a cavity formed by left and right RF PCBs 22a and 22b, and right and left PCBs 23a and 23b, respectively.

Figure 5:
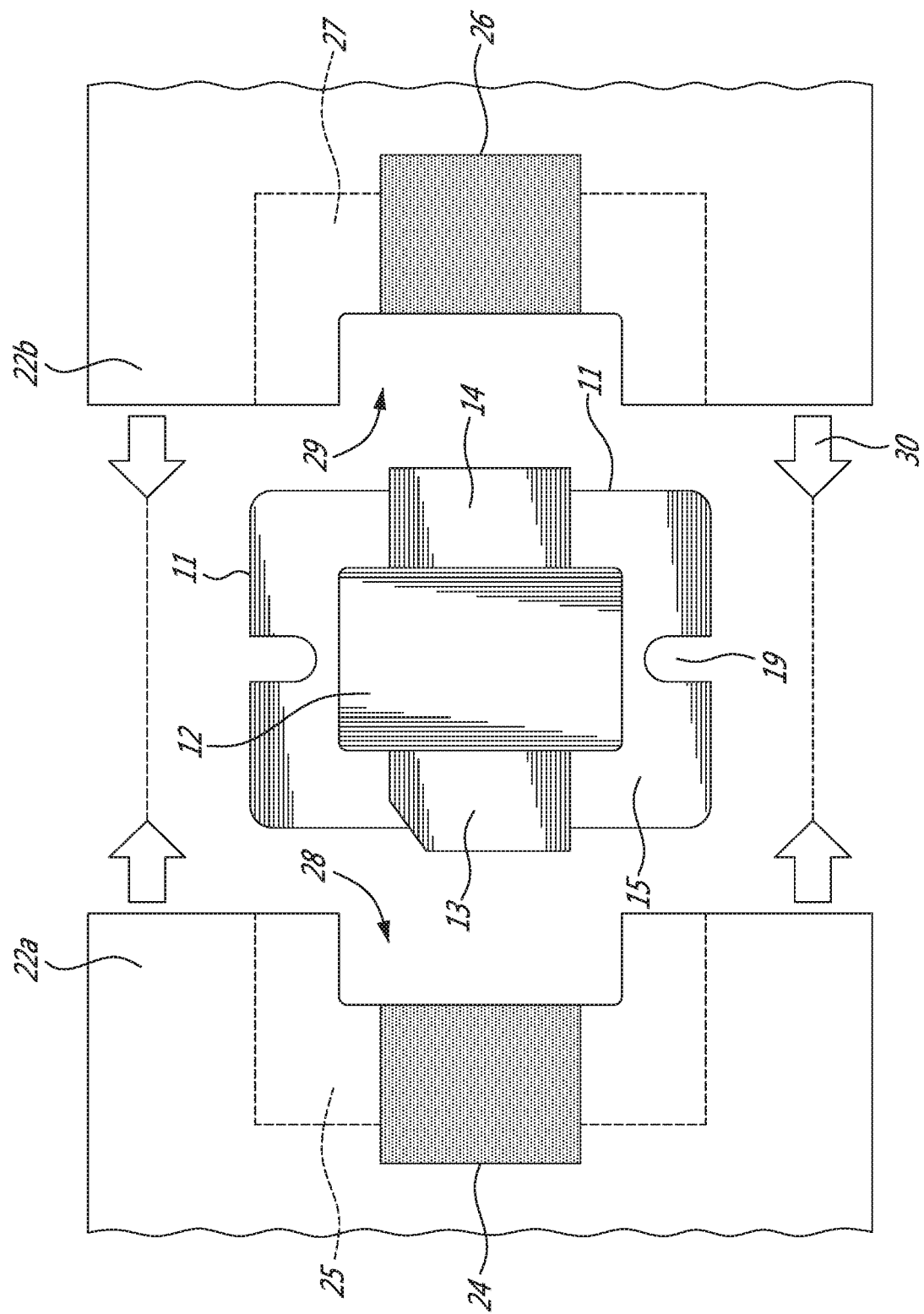
FIG. 5 is a top view of a PA assembly along with left and right PCBs to effectuate a first method of PA assembly.

As shown in FIG. 5, the left RF PCB 22a has a first surface 24 above or on the top surface of the PCB which mates with the drain 13 and a second surface 25 underneath the PCB which mates with the extended heat slug 11 to form a source connection. Similarly, the right RF PCB has a first surface 26 above the PCB 22b to mate with the gate 14 and a second surface 27 to mate with the upper surface of extended heat slug 11 to form a source connection.

In some embodiments, the sliding and mounting of the power amplifier assembly 10 enables low cost and superior performance advantages of a coinless PA. Notch and slot design configurations enable the RF PCB to be wrapped around the coinless PA and in particular around the portion of the PA housing 12 extending between the drain 13, gate 14 and head slug 11. Similarly this design enables the PCB 23a and 23b to be wrapped around the heat slug portion 11 of the PA assembly 10 (see FIG. 4). The RF PCB is typically a two layer micro strip design fabricated with RF materials with an RF ground on one side. Solder connections are made on two surface planes (the top and bottom sides). When combined with the coinless PA, assembly as described herein achieves superior PA performance at a greatly reduced cost compared to current solutions.

In one embodiment, the design and manufacturing consists of two basic steps; (1) slide and (2) mount. In FIG. 5, a slit and notch design is used and in FIG. 6 an open ended slot design is used. This is realized by design modifications to the RF PCB.

In some embodiments, separate left and right RF PCBs 22a and 22b are notched 28 and 29, respectively as shown in FIG. 5.

Process steps for slide and mount manufacturing include the following:

Step 1 includes surface mount technology (SMT) attachment of components onto the RF PCB(s) 22a and 22b with the exception of the coinless PA. This may be done using industry standard SMT processes (solder print, component place and oven reflow). Inspection and test are optional steps depending upon yield loss results. As an alternative, Step 1 could be completed after Step 3 described below.

Step 2 includes a sliding process. In the embodiment of FIG. 5 left and right RF PCBs are slid together around the coinless PA, as shown by arrows 30. In particular, the RF PCB 22a is slid to the right and RF PCB 22b is slid to the left, so that the RF PCB upper surface drain contact area 24 of PCB 22a slides below and makes contact with drain 13; the RF PCB upper surface gate contact area 26 of PCB 22b slides below and makes contact with gate 14; and the RF PCB lower surface source contact areas 25 and 27 slide above the heat slug 11 and makes contact with the source via the upper contact area of heat slug 11.

If the heat slug 11 is not yet attached to the PA housing 12, step 3 includes mounting the PA onto the heats slug 11. Mounting should achieve a high-quality connection at the gate 14, drain 13 and source 15 contact areas of the RF PCB. Desirably, the mounting process should achieve: (1) repeatable "near zero" drain side gap control, (2) void-free bottom side contact to the heat slug, (3) void-free topside contact to the gate 14 and drain 13 leads and (4) orthogonal non-interfering electrical and thermal contact areas. Achieving these objectives may depend on selection of interface material, as summarized in Steps 3A-3D.

Step 3A—Soldering: Hot bar solder reflow on the bottom and top without solder preform (on one or both sides, with or without ultrasonic energy). Solder is pre-deposited on RF PCB(s) using print and reflow in Step 1 or electro-deposited during the RF PCB manufacturing process. Solder metallurgy is adjusted and/or hot bar temperature localization is used to provide temperature separation from SMT components mounted in Step 1.

Step 3B—Preform Solder: Hot bar solder reflow on the bottom and top with solder preform (on one or both sides, with or without ultrasonic energy). Solder preform metallurgy is adjusted and/or hot bar temperature localization is used to provide temperature separation from SMT components mounted in Step 1.

Step 3C—Epoxy Attach: Silver filled epoxy preform is used to make gate 14, drain 13 and source 15 connections. The epoxy preform is cut to shape with a clamp and cured or by equivalent manufacturing process. The RF PCB(s) surface finish could be ENIG (electroless nickel immersion gold), ImAg (immersion silver), ImSn (immersion tin) or other process in the gate, drain and source contact areas.

Step 3D—Alternatives or combinations: other methods include welding or mechanical clamping or a combination of two or more of the above steps.

Mounting is realized by hot bar reflow (or other soldering process) and/or epoxy cure processes with or without mechanical clamping. The mounting process preferably achieves: (1) repeatable "near zero" drain side gap control, (2) void-free bottom side contact to the heat slug 11, (3) void-free topside contact to the gate 14 and drain 13 leads and (4) orthogonal non-interfering electrical and thermal connections. Note that RF PCB pretreatment prior to Step 2 may or may not be performed to clean surfaces, remove oxides and/or activate contact areas.

Figure 6:
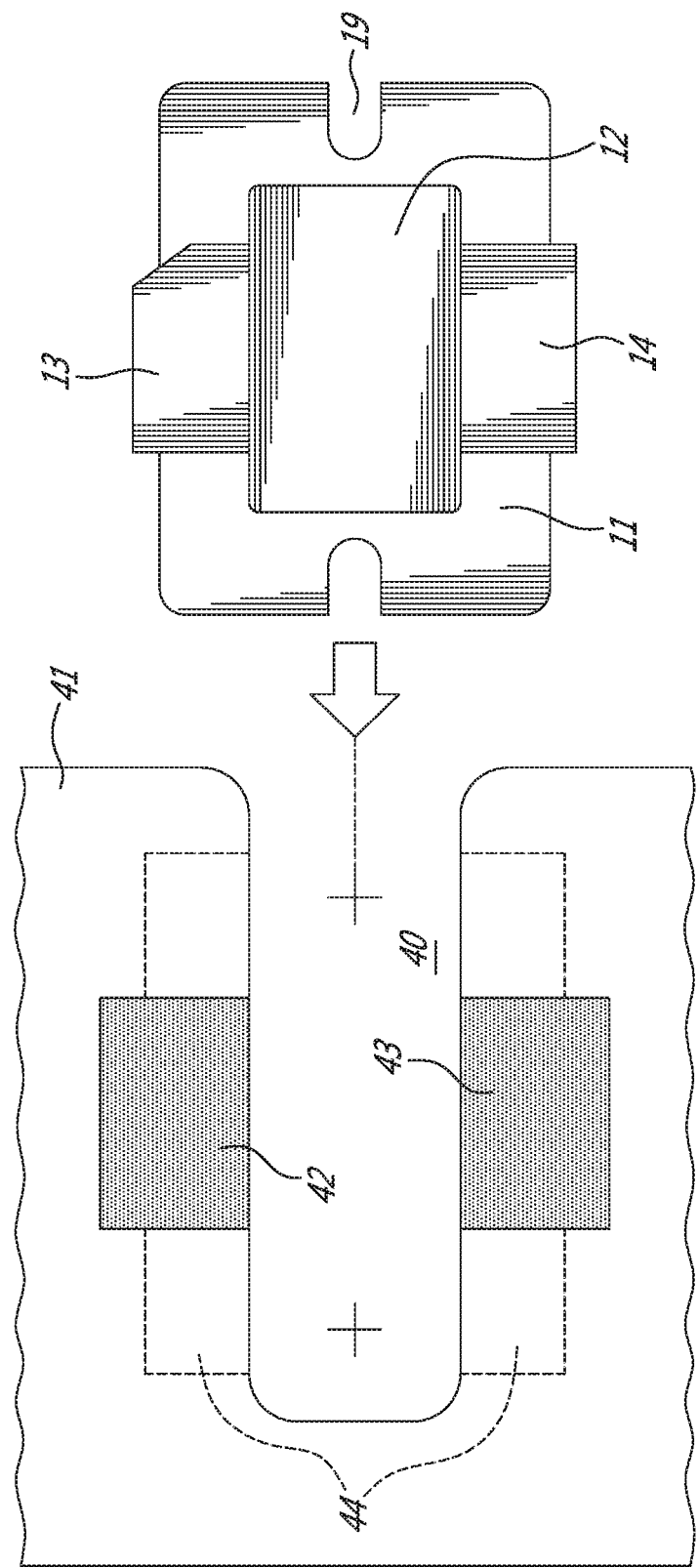
FIG. 6 is a top view of a PA assembly along with a PCB to effectuate a second method of PA assembly.

In some embodiments, a single RF PCB is slotted as shown in FIG. 6, slot 40. The slot design configurations allow the sliding of the RF PCB(s) between the drain and gate leads 13 and 14 respectively and the heat slug 11 of the coinless PA.

In the embodiment of FIG. 6, the coinless PA 12 affixed to the heat slug 11, is slid to the left to fit into the slot 40 so that contact regions of the RF PCB 41 makes contact with corresponding contact regions of the PA 10. In particular, the drain lead 13 will make contact with a corresponding contact region 42 of the RF PCB, the gate lead 14 will make contact with a corresponding contact region 43 and the bottom contact area 44 of the RF PCB will make contact with topside contact area of the heat slug 11 which extends the PA source contact region.

Figure 7A:
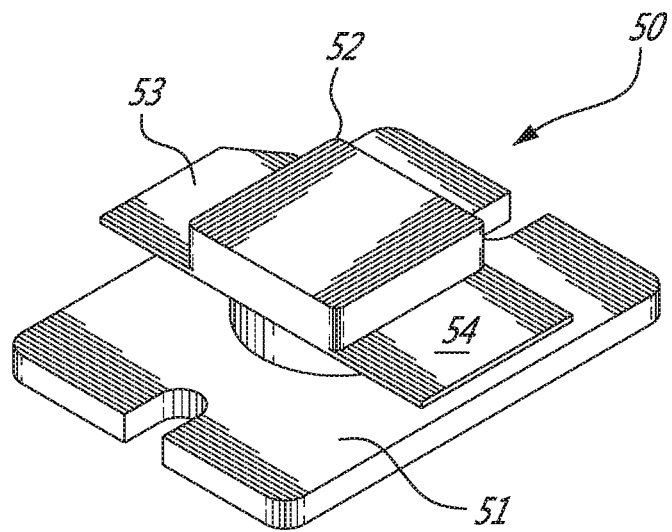
FIG. 7 is a perspective view of a power amplifier assembly according to another embodiment with a PCB to effectuate a third method of PA assembly.

FIG. 7 is another embodiment illustrating the mounting of a modified PA assembly. In this embodiment, the PA assembly 50 also has a housing 52, a drain lead 53 on one end, a gate lead 54 on another end opposite the drain lead 53. The source (not shown) and its contact surface are located underneath the PA assembly housing 52 but in contact with the heat slug 51 which thereby extends the source contact region to the upper surface of the heat slug 51. The PA assembly contact surfaces are adapted to mate with predetermined contact regions of the RF PCB 55. In this embodiment, the portion of the housing 52 extending below the drain lead 53 and gate lead 54 is circular. The circular portion of the housing allows for push and twist manufacturing in a PCB provided with a cavity 56 which matches the shape the upper surface of the PA housing 52, drain lead 53 and gate 54.

When the PA assembly 50 is pushed up through the PCB cavity 56, the PA assembly is then twisted or rotated in cavity 56 such that the drain lead 53 makes contact with the PCB drain contact area 57 on the PCB 55, gate lead 54 makes contact with the PCB gate contact area 58. Source contact surface 59 underneath the PCB 55 lines up with the contact patch or surface of extended heat slug 51, completing electrical contact between the PA assembly 50 and PCB 55.

Process steps for push and twist manufacturing include the following:

Step 1 includes surface mount technology (SMT) attachment of components onto the RF PCB(s) 55 with the exception of the coinless PA. This may be done using industry standard SMT processes (solder print, component place and oven reflow). Inspection and test are optional steps depending upon yield loss results. As an alternative, Step 1 could be completed after Step 3 described below.

Figure 7B:
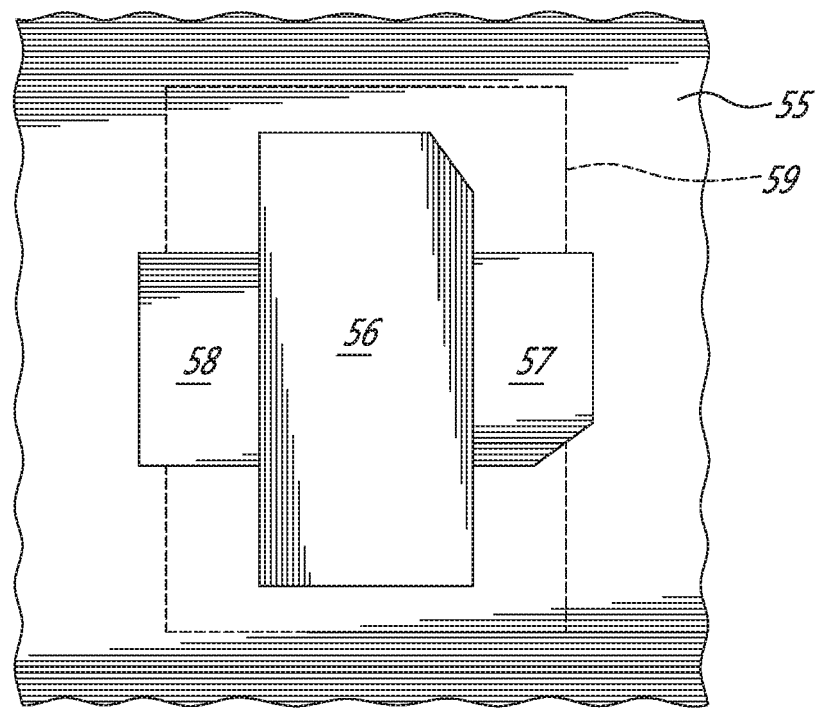

Step 2 includes the inserting or push process. In the embodiment of FIGS. 7 and 7b the PA assembly 50 is pushed or inserted up through slot or open cavity 56 of the RF PCB.

Step 3 then includes rotating clockwise or counter clockwise (depending on the position of the gate and drain contact areas of the PCB) the PA assembly 50 on its vertical axis at 90 degrees to the slot or open cavity 56, so that the RF PCB upper surface drain contact area 57 makes contact with drain 53; the RF PCB upper surface gate contact area 58 makes contact with gate 54; and the RF PCB lower surface source contact area 59 makes contact with the source via the heat slug 51. In effect, the PCB 55 and its corresponding contact regions becomes sandwiched between the gate 54, drain 53 and source contact area on heat slug 51.

If the heat slug 51 is not yet attached to the PA housing 52, step 3 further includes mounting the PA 52 onto the heat slug 51.

Figure 8:
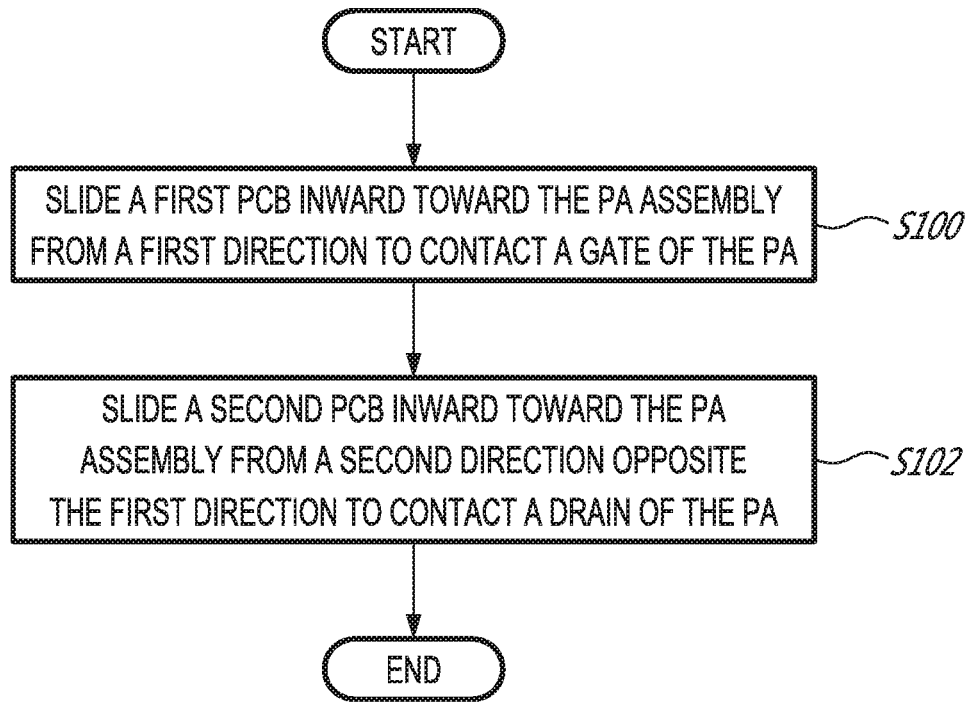
FIG. 8 is a flowchart of a first exemplary process for mounting a power amplifier assembly having an extended heat slug.

FIG. 8 is a flowchart of an exemplary process for mounting a PA assembly having an extended heat slug. The process includes sliding a first PCB inward toward the PA assembly from a first direction to contact a gate of the PA (block S100). The process also includes sliding a second PCB toward the PA assembly from a second direction opposite the first direction to contact a drain of the PA (block S102).

Figure 9:
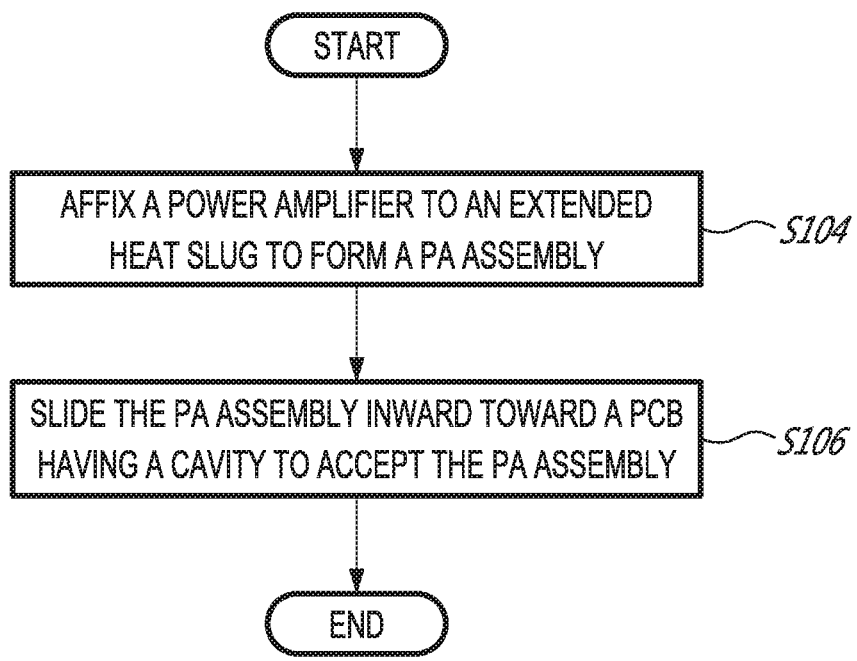
FIG. 9 is a flowchart of a second exemplary process for mounting a power amplifier assembly having an extended heat slug.

FIG. 9 is a flowchart of another exemplary process for mounting a PA assembly having an extended heat slug. The process includes affixing a PA to an extended heat slug to form a PA assembly (block S104). The process also includes sliding the PA assembly inward toward a PCB having a cavity to accept the PA assembly (block S106).

Figure 10:
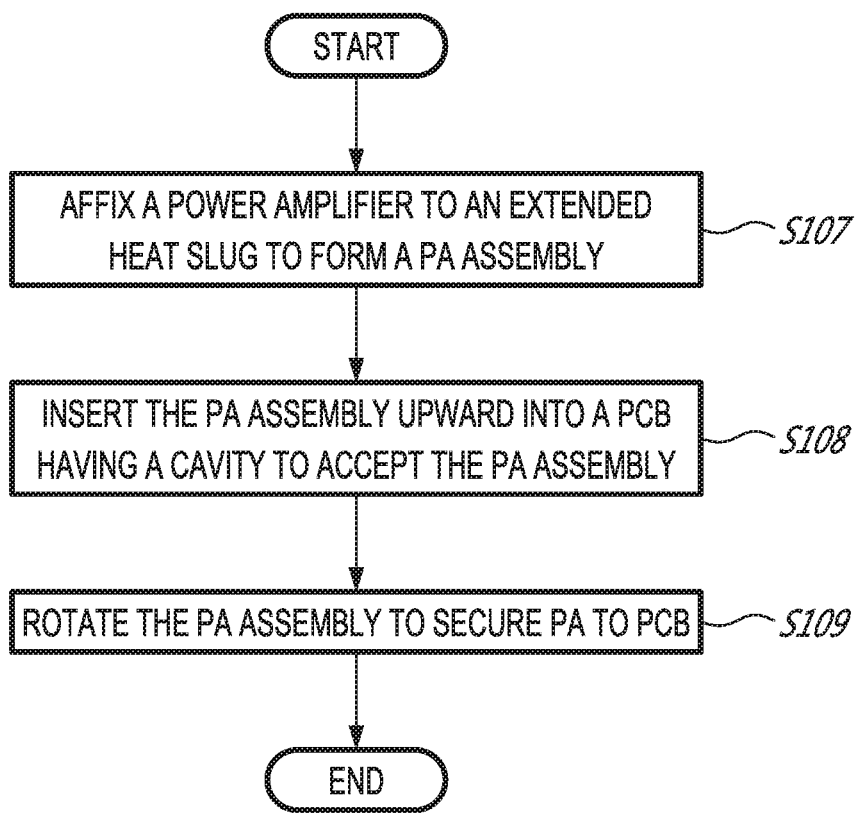
FIG. 10 is a flowchart of a third exemplary process for mounting a power amplifier assembly having an extended heat slug.

FIG. 10 is a flowchart of another exemplary process for mounting a PA assembly having an extended heat slug. The process includes affixing a power amplifier to an extended heat slug to form a power amplifier assembly (block S107). The process also includes inserting the PA assembly upward into a slot or cavity of a PCB of a size suitable to receive the PA assembly (block 108). The process then includes rotating the PA assembly to position the PA contact areas to corresponding regions of the PCB (block 109).

Variants or alternatives include:

The above-described sliding and mounting processes are not limited to coinless PA components. The processes may apply to similar components with any function that is designed for slide and mount manufacturing and may apply to any design consisting of single or multiple PCBs that utilize an extended heat slug with slide and mount manufacturing;

Design modifications to the PCB design configuration that also enable slide & mount manufacturing may be included. For example, a hook shaped slot or any other geometry that enables slide & mount manufacturing may be employed;

Modifications may be made to the slide that enable insert and mount. For example, one process may include folding of the Gate/Drain leads upward and inserting the coinless RF PA through a hole. Gate/Drain leads are then folded down before mounting;

Modifications may be made to the slide that enable an insert and twist motion to mount the PA;

In some embodiments, the RF PCB can be a single board with routed cavities or split into multiple PCBs;

In some embodiments, the RF PCB(s) can be combined with a multilayer PCB that is manufactured as one or separated into multiple pieces;

Some embodiments encompass designs that uses PCB splits, notches or slots for slide and mount manufacturing; and Some embodiments include alternatives to U-Slots that achieve direct mechanical connection to the radio housing.

Some embodiments include an add-on extended Heat slug to existing PA components.

Some embodiments, may include manufacturing alterations to solder application, including without limitation, syringe injection either pre-reflow or post-reflow.

Some embodiments may include manufacturing alterations to mounting connection including without limitation, welding and/or mechanical clamping.

Some embodiments may include dual (or more) temperature reflow process steps that segregate soldering operations and the order of the soldering process.

Some embodiments may include deviations to the heat slug materials, changes to the PCB finish and changes to the coinless PA finish.

Embodiments include wrapping an RF PCBs around a coinless PA (or similarly designed component of any functionality) to eliminate the need for difficult, lengthy and costly manufacturing of coins into the PCB used in current solutions. Superior PA performance may be achieved at a greatly reduced cost. Embodiments include sliding a PA assembly inward toward a PCB having a cavity to accept the PA assembly.

Advantages to some embodiments described herein include:

Greatly reduced cost as compared with existing solutions;

Superior electrical performance. Achieved with ideal RF ground connection to the topside of the extended PA heat slug. Larger contact area and connection to the high conductivity heat slug Cu clad metal layer connected directly to the PA transistor die backside (source);

Superior thermal performance. Coin elimination enables direct mechanically clamped thermal connection to the die cast housing, resulting reduced thermal resistance;

Improved repeatability. Slide and mount manufacturing enables reduced drain side air gap;

Faster Time to Market (TTM) for frequency band variants. Coinless PCBs have fewer process steps and shortened PCB manufacturing cycle time. Cycle time reduction is >50% over current solutions;

Flexibility. Gate and drain side RF PCBs can be constructed with different materials to improve performance and/or reduce costs; and Full and complete RF pre-testability of coinless PA prior to slide and mount manufacturing. Eliminates expensive assembly yield loss with partial or untested PA components.

It will be appreciated by persons skilled in the art that the present embodiments are not limited to what has been particularly shown and described herein above. In addition, unless mention was made above to the contrary, it should be noted that all of the accompanying drawings are not to scale. A variety of modifications and variations are possible in light of the above teachings.

We claim:

1. A method for mounting a power amplifier (PA) assembly having a PA and an extended heat slug, the method comprising:
    sliding a first Printed Circuit Board (PCB) inward toward the PA assembly from a first direction to contact a gate of the PA; and
    sliding a second PCB inward toward the PA assembly from a second direction opposite the first direction to contact a drain of the PA wherein the first and second PCBs have a source contact area that mates with the extended heat slug of the PA assembly when the first and second PCBs are slid inward to encompass the PA assembly, the extended heat slug being in contact with a source of the PA; and
    mounting the PA onto the extended heat slug of the PA assembly before sliding the first and second PCBs inward to encompass the PA assembly.

2. The method of claim 1, wherein:
    the first PCB includes a drain contact area on a side of the first PCB opposite a side of the first PCB having the source contact area;
    the second PCB includes a gate contact area on a side of the second PCB opposite a side of the second PCB having the source contact area;
    the gate of the PA contacts the gate contact area after the sliding; and
    the drain of the PA contacts the drain contact area after the sliding.

3. The method of claim 1, further comprising pre-depositing solder on the first and second PCBs before sliding the first and second PCBs inward to encompass the PA assembly.

4. The method of claim 3, wherein the pre-depositing of solder includes electro-depositing the solder during a PCB manufacturing process prior to sliding the first and second PCBs inward to encompass the PA assembly.

5. The method of claim 1, wherein the first PCB and the second PCB each have an open ended cavity, and wherein the cavities of the first PCB and the second PCB receive a portion of the PA when the first PCB contacts the gate of the PA and the second PCB contacts the drain of the PA.

\* \* \* \* \*